(12) United States Patent
Benavides

(10) Patent No.: US 7,843,386 B2
(45) Date of Patent: Nov. 30, 2010

(54) SYSTEM AND METHOD FOR DETERMINING THE BEAM CENTER LOCATION OF AN ANTENNA

(75) Inventor: Armando Benavides, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/251,083

(22) Filed: Oct. 14, 2008

(65) Prior Publication Data

US 2010/0090915 A1    Apr. 15, 2010

(51) Int. Cl.
*H01Q 3/00* (2006.01)
*G01S 5/04* (2006.01)
(52) U.S. Cl. ..................... 342/360; 342/448
(58) Field of Classification Search ............ 342/357.06, 342/360, 437, 445, 447, 448
See application file for complete search history.

(56) References Cited

U.S. PATENT DOCUMENTS

| | | | |
|---|---|---|---|
| 5,771,019 A | 6/1998 | Wachs et al. | |
| 6,061,016 A * | 5/2000 | Lupinski et al. | 342/159 |
| 6,266,361 B1 | 7/2001 | Huang et al. | |
| 6,633,253 B2 * | 10/2003 | Cataldo | 342/25 R |
| 6,771,217 B1 | 8/2004 | Liu et al. | |
| 6,982,678 B2 | 1/2006 | Obert et al. | |
| 7,298,325 B2 | 11/2007 | Krikorian et al. | |
| 7,414,576 B1 | 8/2008 | Liu | |
| 2002/0180634 A1 * | 12/2002 | Carson | 342/74 |
| 2005/0242991 A1 * | 11/2005 | Montgomery et al. | 342/357.14 |
| 2007/0126629 A1 | 6/2007 | Krikorian et al. | |

FOREIGN PATENT DOCUMENTS

| | | |
|---|---|---|
| JP | 60-13812 A | 6/1992 |
| SU | 1762274 A1 | 8/1990 |

OTHER PUBLICATIONS

Search Report for GB Application No. 0917856.7 dated Jan. 4, 2010.

\* cited by examiner

*Primary Examiner*—Dao L Phan
(74) *Attorney, Agent, or Firm*—Alston & Bird LLP

(57) ABSTRACT

A system and method for determining the beam center location of an antenna, such as a global positioning system (GPS) antenna, are provided. A system for determining the beam center of an antenna may include a plurality of radio frequency (RF) probes, such as Integrated Transfer System (ITS) antenna elements, located at respective predefined positions surrounding the geometrical center of the antenna. The system may also include at least one detector configured to provide a measure of the RF power detected by each respective RF probe. The system may also include a processor configured to determine the beam center of the antenna based upon the predefined position of each RF probe and the measure of the RF power detected by each respective RF probe. A corresponding method is also provided.

23 Claims, 3 Drawing Sheets

SYSTEM AND METHOD FOR DETERMINING THE BEAM CENTER LOCATION OF AN ANTENNA

FIELD OF THE INVENTION

Embodiments of the present invention are generally directed to methods and systems for evaluating an antenna and, more particularly, to methods and systems for determining the beam center location of an antenna.

BACKGROUND OF THE INVENTION

An antenna or an antenna array (hereinafter collectively referenced as an "antenna") shapes (by-design) radiated electromagnetic energy in specific patterns called beams. As such, the location of the center of the beam of an antenna also defines its pointing direction. For navigation satellites, it is useful to be able to point the beam of the navigation payload antenna to a specific location with increased precision as a jamming countermeasure, while for communications satellites, knowledge of the beam center permits communications to be conducted more efficiently. For example, more accurate pointing of the beam center of an antenna can facilitate communications at a lower power level or with improved throughput in comparison to communications conducted with an antenna having a beam center that is pointed with less precision.

The beam center of an antenna may be controlled by mechanically moving the antenna to point in a desired direction. Alternatively, in antenna arrays, the beam center may be controlled by appropriately commanding attenuators and phase shifters to alter the amplitude and phase, respectively, of the signals emitted by the different array elements. Although the beam center of an antenna can be altered, the ability with which the beam center of an antenna can be pointed in a desired direction depends upon the accuracy with which the current beam center may be determined. Additionally, the beam center of an antenna will generally vary with temperature due to, for example, thermal deformations of reflectors or feeds and/or the temperature stability of phase shifters, attenuators or the like. As such, even if the beam center of an antenna is appropriate at one point, the beam center of the antenna may change as the temperature changes such that by monitoring the current beam center of the antenna, the antenna can be appropriately repositioned to maintain its operational efficiency.

In order to determine the beam center of an antenna, the footprint of the antenna may be measured and the beam center may be determined based upon the antenna footprint and antenna location. Based upon the beam center that is determined by this process in comparison to the desired beam center, new settings may be transmitted to the antenna to drive the mechanical positioning system and/or the phase shifters, attenuators or the like so as to adjust the actual beam center to coincide with the desired beam center. For an antenna onboard a satellite, the antenna footprint is measured on the ground following transmission of the radio frequency (RF) signals through the earth's atmosphere. Since the earth's atmosphere is a thermally unstable dispersive media, the beam emitted by the antenna and, in turn, the antenna footprint on the ground may be altered by the atmosphere, thereby resulting in inaccuracies in the determination of the beam center. As such, the commands provided to the antenna in order to alter its pointing direction may be adversely affected with the beam center of the antenna still being offset from its desired position.

In order to provide improved performance for at least some antenna-based systems, such as improved location determination for navigation systems and efficient signaling for communication systems, it may be desirable to provide an improved technique for determining the beam center of an antenna. By more precisely determining the beam center of an antenna, the antenna could be repositioned in order to more accurately align the actual beam center of the antenna to the desired location of the beam center, thereby permitting signals to rise above jamming noise in navigation systems and signals to be communicated more efficiently in communication systems.

BRIEF SUMMARY OF THE INVENTION

Various embodiments of the present invention are therefore provided for determining the beam center of an antenna. In this regard, embodiments of a system and method of the present invention permit the beam center of the antenna to be determined more accurately following deployment of the antenna by avoiding perturbations that may otherwise be introduced by the earth's atmosphere through which the antenna beam must travel. By more accurately determining the beam center of the antenna, the antenna may be more precisely positioned in order to align the actual beam center with the desired beam center.

In one embodiment, a system for determining the beam center of an antenna is provided that includes a plurality of radio frequency (RF) probes located at respective predefined positions surrounding the geometrical center of the antenna. The system of this embodiment may also include at least one detector responsive to the plurality of RF probes and configured to provide a measure of the RF power detected by each respective RF probe. For example, the system may include a plurality of peak detectors configured to identify the peak of the RF power detected by the respective RF probes. Further, the system of this embodiment may include a processor configured to determine the beam center of the antenna based upon the predefined position of each RF probe and the measure of the RF power detected by each respective RF probe.

In one embodiment, the plurality of RF probes may be positioned proximate to and symmetrically about the geometrical center of the antenna to thereby define a plurality of RF probes. For example, the antenna may be a global positioning system (GPS) antenna with a plurality of integrated transfer system (ITS) antenna elements being used as RF probes.

In one embodiment, the RF probes are configured to detect RF signals at each of a downlink frequency and an uplink frequency. As such, the processor of this embodiment may be configured to separately determine the beam center of the antenna for each of the downlink frequency and the uplink frequency based upon the predefined position of each RF probe and the measure of the RF power detected by each respective RF probe at each of the downlink frequency and the uplink frequency. In order to facilitate this separate determination of the beam center of the antenna at each of the downlink frequency and the uplink frequency, the system may also include a band pass filter configured to selectively pass the RF signals having a respective one of the downlink and uplink frequencies.

In accordance with another aspect of the present invention, a method for determining the beam center of an antenna, such as a GPS antenna, is provided. The method may include detecting RF signals with a plurality of RF probes, such as ITS antenna elements, located at respective predefined positions surrounding the geometrical center of the antenna. The method may also provide a measure of the RF power detected by each RF probe and then determine the beam center of the antenna based upon the predefined position of each RF probe and the measure of the RF power detected by each RF probe. In this regard, the provision of a measure of the RF power may include the identification of a peak of the RF power detected by a respective RF probe.

In one embodiment of the method, the detection of RF signals with the RF probes includes separately detecting RF signals at each of a downlink frequency and an uplink frequency. In this regard, this determination of the beam center of the antenna is performed separately for each of the downlink frequency and the uplink frequency based upon the predefined position of each RF probe and the measure of RF power detected by each respective RF probe at each of the downlink frequency and the uplink frequency. In order to facilitate the separate determination of the beam center of the antenna at each of the downlink and uplink frequencies, the method of this embodiment may selectively pass the RF signals at respective ones of the downlink and uplink frequencies.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
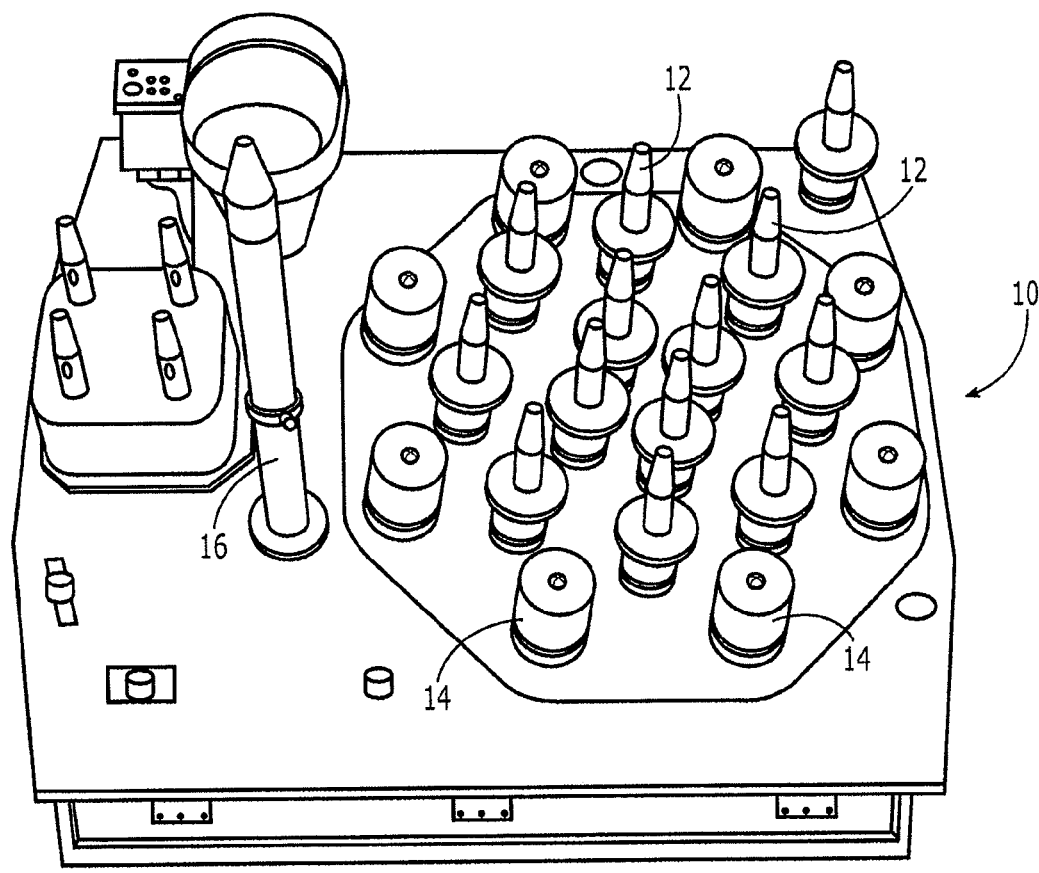
FIG. 1 is a perspective view of a GPS antenna.

Referring now to FIG. 1, a Global Positioning System (GPS) antenna 10 is depicted. The GPS antenna includes a plurality of L-band antenna elements 12 disposed in a central or interior portion of the antenna for transmitting signals having frequencies in the L-band. The GPS antenna also includes a plurality of integrated transfer systems (ITS) antenna elements 14 that are generally positioned about and, therefore, surround the L-band elements. The ITS antenna elements may be used for crosslink purposes, such as to permit communications between two or more antennas, such as the antennas onboard two or more space vehicles, e.g., satellites. Typically the ITS antenna elements support communication in a different frequency band than the L-band antenna elements, such as in the ultra high frequency (UHF) band. Although not described herein, the GPS antenna can also include a number of other antenna elements including a tracking, telemetry and command (TT&C) antenna element 16 having a generally cylindrical bicone antenna 16*a* and a conical spiral antenna 16*b* positioned upon the bicone antenna. While the ITS antenna elements are typically positioned symmetrically about the L-band antenna elements, the TT&C antenna element is generally positioned in a non-symmetrical arrangement and, in the illustrated embodiment, is positioned alongside the L-band antenna elements.

While embodiments of the present invention will be described in conjunction with a GPS antenna 10 utilized for navigation purposes, the system and method of embodiments of the present invention can be employed in conjunction with a wide variety of other types of antennas, be it for navigation purposes, communication purposes or otherwise. Additionally, the system and method of embodiments of the present invention can be employed in conjunction with a single antenna as well as an array of antennas, such as the plurality of L-band antenna elements depicted in FIG. 1. As used herein, both a single antenna and an array of antennas will be referenced as an "antenna".

An antenna, such as the L-band antenna elements 12 depicted in FIG. 1, has a geometrical center based upon the physical arrangement of the antenna elements. An antenna also has a beam center or pointing direction based upon the antenna pattern via which the antenna transmits signals. In order to permit the GPS or other navigation antenna to point at a location in a precise manner and to permit communications and other types of antennas to efficiently communicate, it is desirable to precisely determine the beam center of an antenna.

In order to avoid issues that arise resulting from measurements of an antenna footprint on the ground following the launch of a space vehicle, such as a satellite, that carries the antenna, the system and method of embodiments to the present invention make use of radio frequency (RF) probes that are also incorporated into the antenna to obtain local measurements that have not been perturbed by atmospheric conditions or the like. Indeed, in one embodiment, the existing antenna elements are employed to obtain the measurements necessary to determine the beam center of the antenna. As such, the system of one embodiment of the present invention may include a plurality of radio frequency (RF) probes located at respective predefined positions relative to the geometrical center of the antenna. In this regard, the ITS antenna elements 14 may serve as the RF probes. As shown in FIG. 1 and, in more detail, in FIG. 2 in which $P_1, P_2 \ldots P_8$ represent eight RF probes, the ITS antenna elements are positioned in a symmetrical arrangement surrounding the geometrical center of the antenna 10. Although the symmetrical arrangement of the RF probes, e.g., the ITS antenna elements, may simplify some of the underlying equations via which the beam center is determined, the RF probes may be disposed in other arrangements, such as non-symmetrical arrangements, relative to the geometrical center of the antenna, if so desired. In addition, although the illustrated embodiment includes eight RF probes, the system may include three or any larger number of RF probes. Additionally, while the RF probes may be positioned in various arrangements about the geometrical center of the antenna, the system of one embodiment includes RF probes that are positioned so as not to be clustered together. For example, in an embodiment that includes three RF probes, the three RF probes may be positioned so as to form an equilateral triangle that has a geometrical center that coincides with the geometrical center of the antenna.

In operation, the system of one embodiment of the present invention determines the beam center of the antenna at least at one frequency of interest, and, in one embodiment, at each of a plurality of frequencies of interest. For example, the antenna may be configured to transmit signals at a downlink frequency and to receive signals at an uplink frequency. As such, the system of one embodiment may be configured to separately determine the beam center of the antenna at each of the uplink and downlink frequencies.

Figure 3:
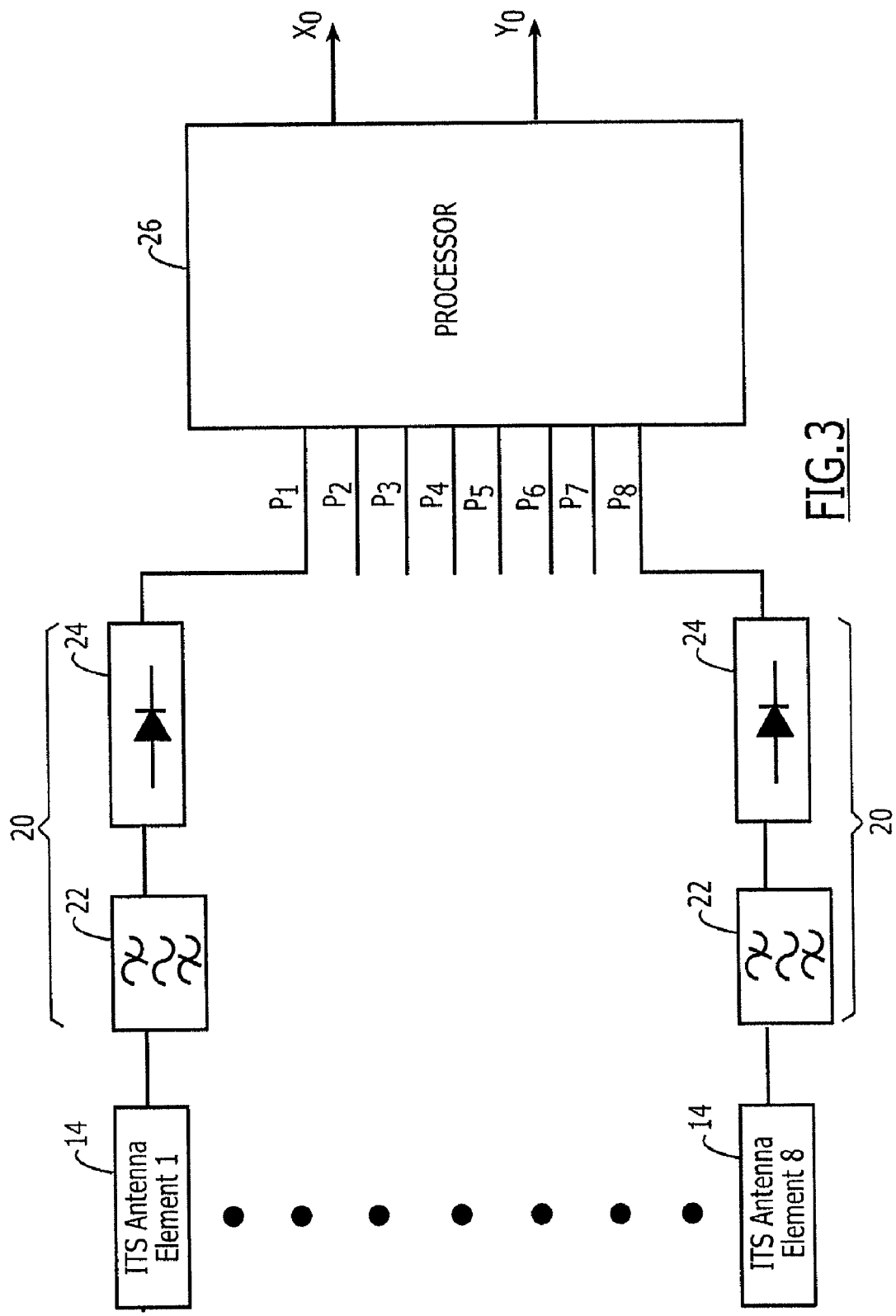
FIG. 3 is a block diagram of a system for determining the center of an antenna in accordance with one embodiment to the present invention.

In operation, the antenna is configured to transmit signals of a predefined frequency. For example, the L-band antenna elements 12 of the GPS antenna 10 of FIG. 1 may transmit signals having an L-band frequency. The RF probes, such as the ITS antenna elements 14, can then receive the RF signals. The system of one embodiment also includes at least one detector responsive to the plurality of RF probes and configured to provide a measure of the RF signals, such as a measure of the RF power, detected by each respective RF probe. In this regard, the system of one embodiment may include a plurality of detectors, one of which is associated with each RF probe and is configured to receive the RF signals detected by the respective RF probe. In conjunction with the determination of the beam center, the detectors may be peak amplitude detectors configured to identify the peak of the RF power detected by the respective RF probe. Although a peak detector may be configured in a variety of manners, the embodiment of the system depicted in FIG. 3 includes a peak detector 20 comprised of a band pass filter 22 configured to selectively pass the RF signals having frequencies within the L-band and to reject RF signals having frequencies outside of the L-band in combination with a diode 24 that is configured to provide the absolute value of the RF signals that have been passed by the band pass filter by rectifying those signals.

The system of one embodiment of the present invention also includes a processor 26 for receiving the measure of the RF signals detected by each respective RF probe, such as the peak amplitude of the RF power detected by each respective RF probe. The processor may be embodied in a number of different ways. For example, the processor may be embodied as various processing means such as a processing element, a microprocessor, a coprocessor, a controller or various other processing devices including integrated circuits such as, for example, an ASIC (application specific integrated circuit). Based upon the predefined position of each RF probe and the measure of the RF signals detected by each respective RF probe, such as the peak amplitude of the RF power detected by each respective RF probe, the processor is configured to determine the beam center of the antenna. In this regard, the x and y coordinates of the beam center (as measured relative to the geometrical center) of the antenna may be determined by the processor in accordance with the following equations:

$$x_0 = \frac{\sqrt{P_1}\,x_1 + \sqrt{P_2}\,x_2 + \sqrt{P_3}\,x_3 + \sqrt{P_4}\,x_4 + \sqrt{P_5}\,x_5 + \sqrt{P_6}\,x_6 + \sqrt{P_7}\,x_7 + \sqrt{P_8}\,x_8}{\sqrt{P_1} + \sqrt{P_2} + \sqrt{P_3} + \sqrt{P_4} + \sqrt{P_5} + \sqrt{P_6} + \sqrt{P_7} + \sqrt{P_8}} = \frac{\sum_{n=1}^{8}\sqrt{P_n}\,x_n}{\sum_{n=1}^{8}\sqrt{P_n}}$$

$$y_0 = \frac{\sqrt{P_1}\,y_1 + \sqrt{P_2}\,y_2 + \sqrt{P_3}\,y_3 + \sqrt{P_4}\,y_4 + \sqrt{P_5}\,y_5 + \sqrt{P_6}\,y_6 + \sqrt{P_7}\,y_7 + \sqrt{P_8}\,y_8}{\sqrt{P_1} + \sqrt{P_2} + \sqrt{P_3} + \sqrt{P_4} + \sqrt{P_5} + \sqrt{P_6} + \sqrt{P_7} + \sqrt{P_8}} = \frac{\sum_{n=1}^{8}\sqrt{P_n}\,y_n}{\sum_{n=1}^{8}\sqrt{P_n}}$$

Figure 2:
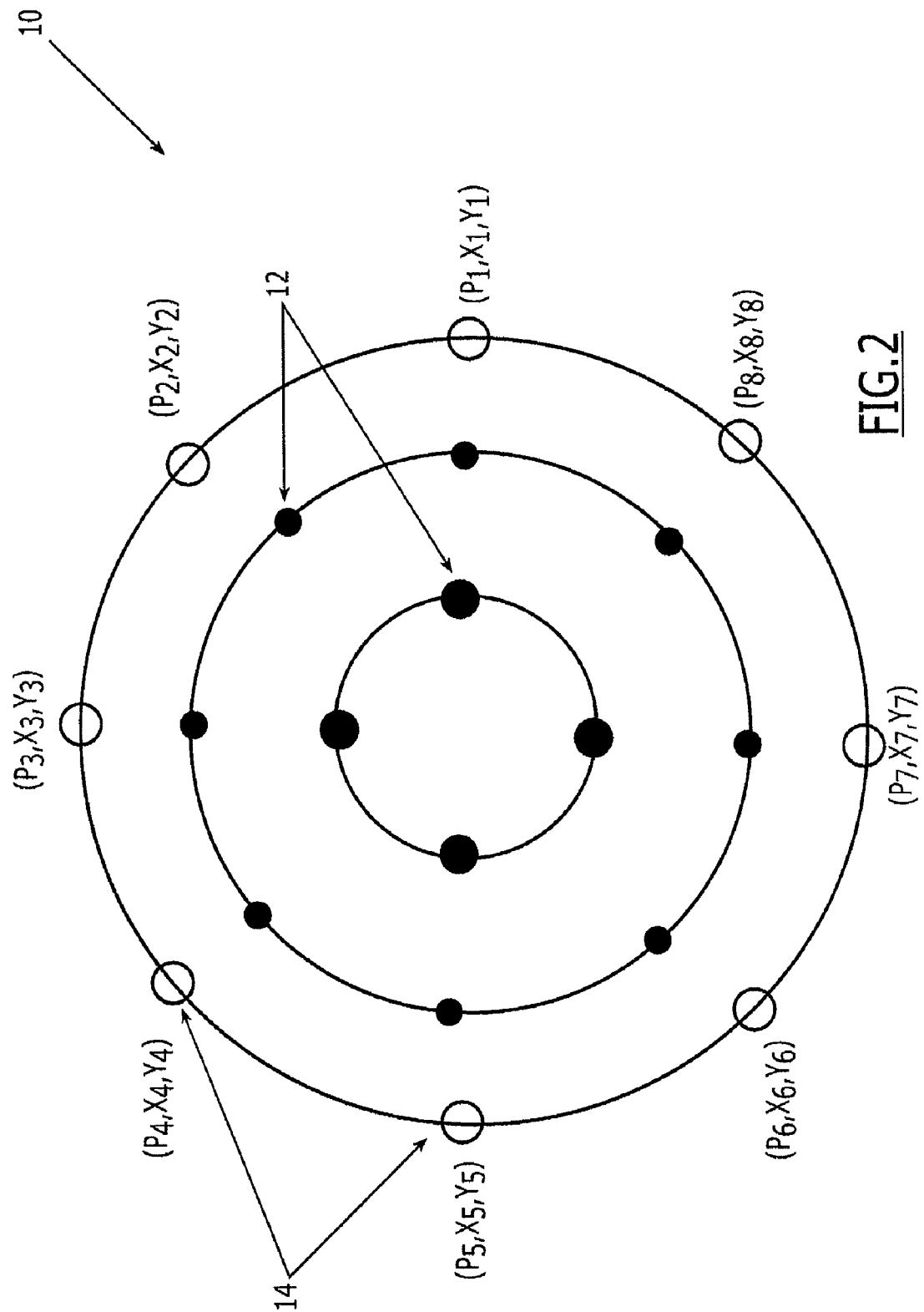
FIG. 2 is a schematic representation of the integrated transfer system (ITS) antenna elements and the L-band antenna elements of a GPS antenna.

In the foregoing equations, $P_i$ (i=1 ... 8) represents the peak power of the RF signals detected by the i-th RF probe, while $x_i$ and $y_i$ (i=1 ... 8) represent x and y positions of the i-th RF probe relative to the geometrical center of the antenna. In addition, $x_0$ and $y_0$ represent the x and y coordinates of the beam center relative to the geometrical center of the antenna. Additionally, although FIG. 3 only depicts the processing elements associated with $P_1$ and $P_8$, the system of this embodiment would also include the same processing elements for each of the other RF probes. Moreover, although FIGS. 1 and 2 depict the RF probes being disposed in an evenly spaced, symmetrical arrangement, the processor 26 may also be configured to determine the beam center of the antenna in instances in which the RF probes are not evenly spaced and/or are not symmetric relative to the geometrical center of the antenna, such as by implementing the foregoing equations which are applicable to both symmetric and non-symmetric arrangements of RF probes.

In instances in which the RF probes detect RF signals having equal peak power, the beam center will coincide with the geometrical center of the antenna such that $x_0$ and $y_0$ are each zero. In contrast, if there is a difference in the peak power of the RF signals detected by the RF probes, the beam center will be offset from the geometrical center of the antenna. By way of example, the beam displacement $(\Delta x_0, \Delta y_0)$ per decibel of power change in opposing antenna elements, such as $P_2$ and $P_6$ of the embodiment depicted in FIG. 2 can be expressed as follows:

$$\Delta x_0 = \frac{\ln(10)}{20}\left[\left(\frac{x_6}{\sum_{n=1}^{8}\sqrt{P_n}} - \frac{\sum_{n=1}^{8}\sqrt{P_n}\,x_n}{\left(\sum_{n=1}^{8}\sqrt{P_n}\right)^2}\right)\sqrt{P_6}\,\Delta P_6 dB + \left(\frac{x_2}{\sum_{n=1}^{8}\sqrt{P_n}} - \frac{\sum_{n=1}^{8}\sqrt{P_n}\,x_n}{\left(\sum_{n=1}^{8}\sqrt{P_n}\right)^2}\right)\sqrt{P_2}\,\Delta P_2 dB\right]$$

$$\Delta y_0 = \frac{\ln(10)}{20}\left[\left(\frac{y_6}{\sum_{n=1}^{8}\sqrt{P_n}} - \frac{\sum_{n=1}^{8}\sqrt{P_n}\,y_n}{\left(\sum_{n=1}^{8}\sqrt{P_n}\right)^2}\right)\sqrt{P_6}\,\Delta P_6 dB + \left(\frac{y_2}{\sum_{n=1}^{8}\sqrt{P_n}} - \frac{\sum_{n=1}^{8}\sqrt{P_n}\,y_n}{\left(\sum_{n=1}^{8}\sqrt{P_n}\right)^2}\right)\sqrt{P_2}\,\Delta P_2 dB\right]$$

Once the beam center of an antenna has been determined, the antenna may be commanded to point in the desired direction, such as by moving the antenna in such a way that the actual beam center (as determined in the manner described above) coincides with the desired beam pointing direction. Such movement of the antenna can be provided in a conventional manner, such as by means of a mechanical positioning system of an antenna and/or by appropriately commanding the attenuators, phase shifters or the like that provide the RF signals to the array elements of an antenna array. By more closely aligning the actual beam center and the desired beam center, the performance of the antenna can be improved, such as by permitting a GPS system to more accurately determine location or a communications antenna to communicate more efficiently. Since the beam center may vary based upon the pressure and temperature to which the antenna is subjected, the method and system of one embodiment may repeatedly determine the beam center and may correspondingly repeatedly adjust the beam pointing direction in order to maintain pointing direction stability of the antenna as the pressure and/or temperature varies.

While the system and method of one embodiment has been described in conjunction with determining the beam center of an antenna for RF signals having a respective frequency, the system and method may separately determine the beam center of the antenna for RF signals having each of a number of different frequencies, such as each of a downlink frequency and an uplink frequency. In this regard, the system of this embodiment may include a plurality of band pass filters 22 (depicted in FIG. 3 as a single element) associated with each respective RF probe, such that a first band pass filter may selectively pass the RF signals at the downlink frequency while the rejecting signals having other frequencies, and a second band pass filter may selectively pass the RF signals at the uplink frequency while rejecting the signals having other frequencies. Thus, an antenna may be appropriately positioned to receive downlink signals and to transmit uplink signals in an efficient manner.

Embodiments of the system and method offer numerous advantages. In conjunction with uplink signals, for example, embodiments of the system and method only requires the uplink signal, thereby eliminating ground dependence by not requiring a ground beacon transmitter. Also, embodiments of the system and method may only require the received and transmitted signals without any requirement for on-board generated calibration signals. Further, embodiments of the system and method permit antenna pointing correction to be performed at any moment and, therefore, without delay, without communication traffic interruption or the need to await for an optimum time of minimum or low traffic since the beam center pointing can be determined independent of the antenna and since there are no interfering antenna pointing calibration routines.

Many modifications and other embodiments of the invention will come to mind to one skilled in the art to which this invention pertains having the benefit of the teachings presented in the foregoing descriptions and the associated drawings. Therefore, it is to be understood that the inventions is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A system for determining a beam center of an antenna, the system comprising:
   a plurality of radio frequency (RF) probes located at respective predefined positions surrounding a geometrical center of the antenna;
   at least one detector responsive to the plurality of RF probes and configured to provide a measure of RF power detected by each respective RF probe; and
   a processor configured to determine the beam center of the antenna based upon the predefined position of each RF probe and the measure of the RF power detected by each respective RF probe.

2. A system according to claim 1 wherein said at least one detector comprises a plurality of peak detectors configured to identify a peak of the RF power detected by respective RF probes.

3. A system according to claim 1 wherein the plurality of RF probes are positioned proximate to and symmetrically about the geometrical center of the antenna to thereby define a plurality of RF probe pairs with each RF probe pair including a pair of diametrically opposed RF probes.

4. A system according to claim 1 wherein the antenna comprises a global positioning system (GPS) antenna, and wherein the RF probes comprise a plurality of Integrated Transfer System (ITS) antenna elements.

5. A system according to claim 4 wherein the GPS antenna comprises a plurality of GPS antenna elements surrounded by the plurality of ITS antenna elements.

6. A system according to claim 1 wherein the RF probes are configured to detect the RF power at each of a downlink frequency and an uplink frequency, and wherein the processor is configured to separately determine the beam center of the antenna for each of the downlink frequency and the uplink frequency based upon the predefined position of each RF probe and the measure of the RF power detected by each respective RF probe at each of the downlink frequency and the uplink frequency.

7. A system according to claim 6 further comprising a band pass filter configured to selectively pass RF signals at a respective one of the downlink and uplink frequencies.

8. A method for determining a beam center of an antenna, the method comprising:
   detecting radio frequency (RF) signals with a plurality of RF probes located at respective predefined positions surrounding a geometrical center of the antenna;
   providing a measure of RF power detected by each respective RF probe; and
   determining the beam center of the antenna based upon the predefined position of each RF probe and the measure of the RF power detected by each respective RF probe.

9. A method according to claim 8 wherein providing a measure of the RF power comprises identifying a peak of the RF power detected by a respective RF probe.

10. A method according to claim 8 wherein the plurality of RF probes are positioned proximate to and symmetrically about the geometrical center of the antenna to thereby define a plurality of RF probe pairs with each RF probe pair including a pair of diametrically opposed RF probes.

11. A method according to claim 8 wherein the antenna comprises a global positioning system (GPS) antenna, and wherein the RF probes comprise a plurality of Integrated Transfer System (ITS) antenna elements.

12. A method according to claim 11 wherein the GPS antenna comprises a plurality of GPS antenna elements surrounded by the plurality of ITS antenna elements.

13. A method according to claim 8 wherein detecting RF signals with the RF probes comprises separately detecting RF signals at each of a downlink frequency and an uplink frequency, and wherein determining the beam center comprises separately determining the beam center of the antenna for each of the downlink frequency and the uplink frequency based upon the predefined position of each RF probe and the measure of RF power detected by each respective RF probe at each of the downlink frequency and the uplink frequency.

14. A method according to claim 13 further comprising selectively passing the RF signals at a respective one of the downlink and uplink frequencies.

15. A system for determining a beam center of a global positioning system (GPS) antenna, the system comprising:
   a plurality of Integrated Transfer System (ITS) antenna elements located at respective predefined positions proximate to and surrounding a geometrical center of the GPS antenna;
   at least one detector responsive to the plurality of ITS antenna elements and configured to provide a measure of RF power detected by each respective ITS antenna element; and a processor configured to determine the beam center of the GPS antenna based upon the predefined position of each ITS antenna element and the measure of the RF power detected by each respective ITS antenna element.

16. A system according to claim 15 wherein said at least one detector comprises a plurality of peak detectors configured to identify a peak of the RF power detected by respective ITS antenna elements.

17. A system according to claim 15 wherein the plurality of ITS antenna elements are positioned symmetrically about the geometrical center of the GPS antenna to thereby define a plurality of ITS antenna element pairs with each ITS antenna element pair including a pair of diametrically opposed ITS antenna elements.

18. A system according to claim 15 wherein the ITS antenna elements are configured to detect the RF power at each of a downlink frequency and an uplink frequency, and wherein the processor is configured to separately determine the beam center of the GPS antenna for each of the downlink frequency and the uplink frequency based upon the predefined position of each ITS antenna element and the measure of the RF power detected by each respective ITS antenna element at each of the downlink frequency and the uplink frequency.

19. A system according to claim 18 further comprising a band pass filter configured to selectively pass RF signals at a respective one of the downlink and uplink frequencies.

20. A system according to claim 18 wherein the GPS antenna comprises a plurality of GPS antenna elements surrounded by the plurality of ITS antenna elements.

21. A system according to claim 1 wherein the processor is configured to determine the beam center relative to the geometrical center of the antenna.

22. A method according to claim 8 wherein determining the beam center comprises determining the beam center relative to the geometrical center of the antenna.

23. A system according to claim 15 wherein the processor is configured to determine the beam center relative to the geometrical center of the antenna.

* * * * *